(12) United States Patent
Schaller et al.

(10) Patent No.: US 11,211,551 B2
(45) Date of Patent: Dec. 28, 2021

(54) CURRENT SENSOR PACKAGE WITH CONTINUOUS INSULATION

(71) Applicant: Infineon Technologies AG, Neubiberg (DE)

(72) Inventors: Rainer Markus Schaller, Saal a.d. Donau (DE); Volker Strutz, Tegernheim (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 16/441,304

(22) Filed: Jun. 14, 2019

(65) Prior Publication Data

US 2019/0386206 A1     Dec. 19, 2019

(30) Foreign Application Priority Data

Jun. 15, 2018 (DE) ...................... 10 2018 114 426.1

(51) Int. Cl.
| | |
|---|---|
| H01L 21/76 | (2006.01) |
| H01L 43/04 | (2006.01) |
| H01L 23/31 | (2006.01) |
| H01L 23/00 | (2006.01) |
| H01L 43/12 | (2006.01) |
| H01L 43/02 | (2006.01) |
| H01L 43/14 | (2006.01) |
| H01L 43/06 | (2006.01) |
| G01R 15/20 | (2006.01) |
| G01R 19/00 | (2006.01) |
| H01L 23/495 | (2006.01) |

(52) U.S. Cl.
CPC ............ *H01L 43/04* (2013.01); *G01R 15/202* (2013.01); *G01R 15/205* (2013.01); *G01R 19/0092* (2013.01); *H01L 23/3121* (2013.01); *H01L 23/49541* (2013.01); *H01L 24/48* (2013.01); *H01L 24/85* (2013.01); *H01L 43/02* (2013.01); *H01L 43/06* (2013.01); *H01L 43/12* (2013.01); *H01L 43/14* (2013.01); *H01L 2224/48091* (2013.01); *H01L 2224/48106* (2013.01); *H01L 2224/48177* (2013.01); *H01L 2224/48247* (2013.01)

(58) Field of Classification Search
None
See application file for complete search history.

(56) References Cited

U.S. PATENT DOCUMENTS

| | | | |
|---|---|---|---|
| 5,200,809 A * | 4/1993 | Kwon | .................. H01L 23/367 |
| | | | 257/707 |
| 8,907,437 B2 | 12/2014 | Milano et al. | |

(Continued)

FOREIGN PATENT DOCUMENTS

JP     2003-32974     11/2003

*Primary Examiner* — Hung K Vu
(74) *Attorney, Agent, or Firm* — Dicke, Billig & Czaja, PLLC

(57) ABSTRACT

A current sensor package, comprises a current path and a sensing device. The sensing device is spaced from the current path, and the sensing device is configured for sensing a magnetic field generated by a current flowing through the current path. Further, the sensing device comprises a sensor element. The sensing device is electrically connected to a conductive trace. An encapsulant extends continuously between the current path and the sensing device.

16 Claims, 4 Drawing Sheets

(56) References Cited

U.S. PATENT DOCUMENTS

| | | |
|---|---|---|
| 9,678,173 B2 | 6/2017 | Castro Serrato |
| 2006/0181264 A1 | 8/2006 | Catona et al. |
| 2014/0264677 A1* | 9/2014 | Ausserlechner ........ H01L 29/82 |
| | | 257/427 |
| 2017/0131329 A1 | 5/2017 | Gorai et al. |
| 2018/0156845 A1 | 6/2018 | Suzuki |

* cited by examiner

CURRENT SENSOR PACKAGE WITH CONTINUOUS INSULATION

CROSS-REFERENCE TO RELATED APPLICATION

This Utility Patent Application claims priority to German Patent Application No. 10 2018 114 426.1, filed Jun. 15, 2018, which is incorporated herein by reference.

BACKGROUND OF THE INVENTION

Field of the Invention

The present invention relates to current sensor packages and methods of manufacturing a current sensor package.

Description of the Related Art

Packages may be denoted as encapsulated electronic chips with electrical connects extending out of the encapsulant and being mounted to an electronic periphery, for instance on a printed circuit board.

Magnetic current sensors, i.e. current sensors sensing a magnetic field generated by the current to be measured, provide for contactless measurement of the current and allow galvanic separation of the current to be measured and the sensor.

Packaging cost is an important driver for the industry. Related with this are performance, dimensions and reliability. The different packaging solutions are manifold and have to address the needs of the particular application.

DE 11 2012 003 079 T5 discloses a current sensor packaged in an integrated circuit package to include a magnetic field sensing circuit, a current conductor and an insulator that meets the safety isolation requirements for reinforced insulation under the UL 60950-1 Standard is presented. The insulator is provided as an insulation structure having at least two layers of thin sheet material. The insulation structure is dimensioned so that plastic material forming a molded plastic body of the package provides a reinforced insulation. According to one embodiment, the insulation structure has two layers of insulating tape. Each insulating tape layer includes a polyimide film and adhesive. The insulation structure and the molded plastic body can be constructed to achieve at least a 500 VRMS working voltage rating.

For these and other reasons, there is a need for the present sensor package and method.

BRIEF DESCRIPTION OF THE DRAWINGS

The accompanying drawings, which are included to provide a further understanding of exemplary embodiments and constitute a part of the specification, illustrate exemplary embodiments of the herein disclosed subject matter.

In the drawings.

DETAILED DESCRIPTION

Figure 1:
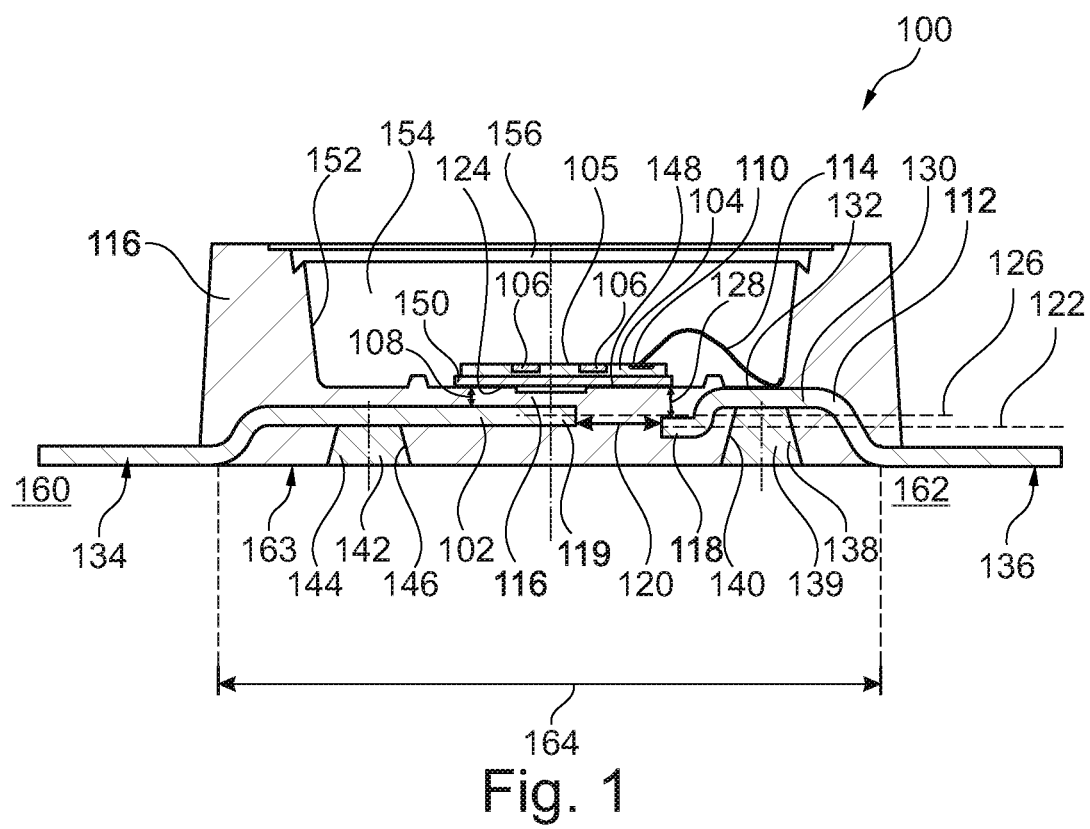
FIG. 1 illustrates a cross-sectional view of a current sensor package according to embodiments of the herein disclosed subject matter.

There may be a need to manufacture a current sensor package with a high level of reliability.

According to a first aspect of the herein disclosed subject matter, a current sensor package is provided.

According to an embodiment, the current sensor package comprises a current path; a sensing device (e.g. a sensor chip), the sensing device being spaced from the current path, and the sensing device being configured for sensing a magnetic field generated by a current flowing through the current path; the sensing device comprising a sensor element, the sensing device being electrically connected to a conductive trace; the current sensor package further comprising an encapsulant extending continuously between the current path and the sensing device.

According to a second aspect of the herein disclosed subject matter, a method of manufacturing a current sensor package is provided.

According to an embodiment, the method comprises: providing a current path; providing a sensing device (e.g. a sensor chip), the sensing device being configured for sensing a magnetic field generated by a current flowing through the current path, the sensing device comprising a sensor element; positioning the sensing device spaced from the current path; electrically connecting the sensing device to a conductive trace; providing an encapsulant extending continuously between the current path in the sensing device.

According to further embodiments of the first aspect, the current sensor package is adapted for providing the functionality of one or more of the herein disclosed embodiments and/or for providing the functionality as required by one or more of the herein disclosed embodiments, in particular of the embodiments of the first and second aspect disclosed herein.

According to further embodiments of the second aspect, the method is adapted for providing the functionality of one or more of the herein disclosed embodiments and/or for providing the functionality as required by one or more of the herein disclosed embodiments, in particular of the embodiments of the first and second aspect disclosed herein.

In the following, further exemplary embodiments of the herein disclosed subject matter are described, any number and any combination of which may be realized in an implementation of aspects of the herein disclosed subject matter.

In the context of the present application, the term "extending continuously" may particularly denote an extension (e.g. of the encapsulant) without any internal interfaces (interfaces within the encapsulant).

In the context of the present application, the term "current sensor package" (or "package" for short) may particularly denote at least one at least partially encapsulated sensor chip with at least one external electric contact.

The term "sensing device" may particularly denote a discrete sensor element or a sensor chip comprising a sensor element.

The term "sensor chip" may particularly denote a chip having at least one integrated sensor element (such as a Hall sensor or a magnetoresistive sensor), e.g. in a surface portion thereof. According to an embodiment, the at least one integrated sensor element is located at a same main surface of the sensor chip on which the contact pad is located. The sensor chip may be a naked die or may be already packaged or encapsulated.

In the context of the present application, the term "encapsulant" may particularly denote a substantially electrically insulating and preferably thermally conductive material surrounding (for example hermetically surrounding) the current path to provide mechanical protection, electrical insulation, and optionally a contribution to heat removal during operation. Such an encapsulant can be, for example, a mold compound.

In the context of the present application, the term "carrier" may particularly denote an electrically conductive structure which may serve as a support for the (at least one) chip. Further, the carrier may also contribute to an electrical connection between components and/or to an electrical connection to a periphery, e.g. of the current sensor package. In other words, the carrier may fulfil a mechanical support function and/or a electrical connection function.

In the context of the present application, the term "component" may particularly denote any electronic member which can be mounted and electrically connected to the package to provide its function to the package. In particular, the component may be a passive component such as an inductor (in particular a coil), a capacitor (such as a ceramic capacitor), an ohmic resistance, an inductance, a diode, a transformer, a sensor, etc. In particular components being not capable of controlling current by another electrical signal may be denoted as passive components. However, the component may also be an active component, in particular may be a component being capable of controlling current by another electrical signal. Active components may be an analog electronic filter with the ability to amplify a signal or produce a power gain, an oscillator, a transistor or another integrated circuit element.

According to an embodiment, the package may be e.g. a Surface Mounted Device (SMD) or a Through Hole Device (THD).

In an embodiment, the package is configured for a working voltage in a range between 100 Volt (V) and 1000 V, e.g. for a working voltage of about 800 V.

The term "device" may in particular denote any device suitable for comprising the package. In particular, according to an embodiment the device is a power train of an at least partially electrically driven vehicle (e.g. an electric vehicle or a hybrid vehicle).

According to an embodiment, the package provides a high reliability and meets safety requirements. The higher the requirements on strength and long-term reliability of the electric insulation between the current path and the sensor device the more important are internal interfaces of the electric insulation. According to an embodiment, internal interfaces of the electric insulation are avoided, in particular internal interfaces between the current path and the sensing device and/or the current path and the conductive trace. Avoiding internal interfaces is advantageous because along with delamination paths of internal interfaces creepage or even clearance paths could open up which might lead to an increased leakage current or even breakthrough. In cracks or slits in the electrical insulation discharges can appear which may lead to long-term degradation of the insulation material and in worst case to a breakthrough event.

Save insulation means highest confidence in in isolation reliability and protection of electrical shock (e.g. caused by accidental voltage transients). Such grade of quality is called "basic" or, for even higher degree of withstand "reinforced". According to the latter grade, e.g. surviving a transient voltage peak nearly at the end of a product lifetime has to be guaranteed with respect to life protection.

On the other hand, high reliability galvanic insulation is sometimes difficult to realize with cheap standard semiconductor package technology especially in low and mid voltage regions. Here, a reliable single layer insulation maybe advantageous. In best case, the insulation is brought from package concept and material, thereby greatly reducing the costs. In particular, additional interlayers may rise package costs as it is the case for stacked die approaches, where a separate insulation platelet is used for galvanic insulation purpose.

Embodiments of the herein disclosed subject matter use in encapsulant extending continuously between the current path and the sensing device of the current sensor package. The continuously extending encapsulant may result in a delamination resistant insulation of the current path in the sensing device. This in turn results in a reliable insulation in the package.

According to an embodiment, the encapsulant also extends continuously between the current path and the conductive trace (to which the contact path of the sensing device is electrically connected). Hence, in an embodiment the encapsulant continuously extends between the current path on the one hand and the sensor device and its associated electrical connections on the other hand.

According to an embodiment, the conductive trace is a carrier, in particular a metallic carrier, further in particular a leadframe.

According to a further embodiment the sensing device is attached to the carrier. For example, where the conductive trace is a carrier, in the method of manufacturing the package the positioning of the sensing device may include attaching the sensing device to the conductive trace and the providing of the encapsulant may include providing the encapsulant continuously between the current path on the one hand and the sensing device in the conductive trace on the other hand.

According to a further embodiment, an interconnect between the sensing device and the conductive trace is provided by at least one bond wire and/or at least one through silicon via (TSV).

According to an embodiment, the sensing device has a main surface and part of the main surface is attached to the carrier whereas the remaining part of the main surface extends beyond the carrier and over the current path. According to an embodiment, a sensor of the sensing device is positioned within the sensing device so as to be located proximate to the current path. According to an embodiment, the carrier has an attachment portion to which the part of the main surface of the sensing device is attached. According to a further embodiment, the attachment portion of the carrier is flat.

According to an embodiment, the sensing device is attached to the encapsulant. For example, the method of manufacturing the package may comprise providing the encapsulant over at least part of the current path, wherein the positioning of the sensing device includes attaching the sensing device to the encapsulant.

For example, according to an embodiment the package comprises a pre-mold part formed from the encapsulant. According to an embodiment, the premold part continuously extends over at least a portion of the current path and between the current path and the conductive trace. According to an embodiment, the encapsulant extends over at least a portion of the conductive trace. According to an embodiment, a method of manufacturing a current sensor package comprises providing the encapsulant about the current path (e.g. about part of the current path) and/or about the conductive trace (e.g. about part of the conductive trace to thereby provide the premold part. Hence, in an embodiment the premold part comprises the encapsulant and at least one of the current path and the conductive trace.

According to an embodiment, the sensing device is attached to the premold part, e.g. in an attachment surface of the premold part. According to an embodiment, the encapsulant is has a recess wherein the attachment surface is provided at a bottom of the recess. In this way, walls of the recess surrounding the bottom surface provide mechanical protection of the sensing device. According to a further embodiment, the recess is covered with a lid and/or filled with a filling material. The lid/filling material may provide additional protection of the sensing device and/or a bond wire (if present). According to an embodiment, the filling material comprises silicone, epoxy, etc.

According to an embodiment, the sensing device is attached to the encapsulant (or, in another embodiment to the carrier) by a die attach layer. According to an embodiment, the die attach layer is applied to the sensing device on wafer scale. In other words, according to an embodiment, the die attach layer is applied to the wafer before dicing the wafer into individual dies, e.g. by sawing. Typically, for a sawing procedure the die attach layer is applied to the wafer in order to attach to wafer to a saw foil. According to an embodiment, the die attach layer is a die attach film (DAF). Since the die attach film usually appears better to the wafer than to the saw foil, removal of the individual die from the saw foil leaves the die attach film remaining on the die. In accordance with an embodiment, this die attach film originating from the dicing procedure (sawing procedure) is used to attach the die (the sensing device) to the carrier or the encapsulant. According to a further embodiment, the die attach layer comprises a conductive adhesive (e.g. is a layer of conductive adhesive). According to another embodiment, the die attach layer comprises a non-conductive adhesive (e.g. is a layer of non-conductive adhesive). According to a further embodiment, the die attach layer may comprise (or consist of) a solder, e.g. a soft solder, a hard solder, a diffusion solder, etc.

In a further embodiment, the sensing device is mounted (in particular are directly soldered, sintered or glued) to a surface of carrier or the encapsulant. In other words, the material of the solder, sinter material and/or glue (in particular an electrically conductive glue) may be the only material between the sensing device on the one hand and the carrier on the other hand.

According to an embodiment, the current path is formed from a leadframe.

According to an embodiment the current path and the conductive trace are initially (i.e. in an early manufacturing stage) provided by a single leadframe element, which comprises the current path, the conductive trace and a connecting portion connecting the current path and the conductive trace. After providing the encapsulant over at least portions of the current path and the conductive trace, the connecting portion may be removed, thereby resulting in separate, electrically isolated current path and conductive trace. In other embodiments, any other single carrier (other than the leadframe element) may be used to initially provide the current path and the conductive trace by a single carrier.

In an embodiment, the carrier is a metallic carrier, in particular a leadframe. In the context of the present application, the term "leadframe" may particularly denote a preferred example of a carrier being configured as a sheet-like metallic structure which can be punched or patterned so as to form leadframe sections for mounting the chip(s), and connection leads as pin sections for electric connection of the package to an electronic environment when the chips are mounted on the leadframe. In an embodiment, the leadframe may be a metal plate (in particular made of copper) which may be patterned, for instance by stamping or etching. Forming the carrier as a leadframe is a cost-efficient and mechanically as well as electrically highly advantageous configuration in which a low ohmic connection of the chip(s) (and optionally other component(s)) can be combined with a robust support capability of the leadframe. Furthermore, a leadframe may contribute to the thermal conductivity of the package and may remove heat generated during operation of the chip(s) (and, if present, the component(s)) as a result of the high thermal conductivity of the metallic (in particular copper) material of the leadframe. A leadframe or any other metallic carrier may be preferred due to its simplicity.

In an embodiment, the at least one sensor chip comprises at least one of the group consisting of a controller circuit, a driver circuit, and a sensor element. All these circuits may be integrated into one semiconductor chip, or separately in different chips. For instance, a corresponding current sensor application may be realized by the chip(s), wherein integrated circuit elements of such a sensor chip may comprise at least one sensor element and semiconductor elements, such as a transistor (in particular a MOSFET, metal oxide semiconductor field effect transistor), at least one diode, etc.

In an embodiment, the at least one sensing device is at least partially embedded by a separate encapsulant (i.e. a further encapsulant which may be physically different from the encapsulant extending continuously between the current path and the sensing device). In other words, two separate encapsulants may be provided in the package, and two separate encapsulation procedures may be carried out. For example, it is possible to encapsulate the sensing device together with a portion of the carrier by a first encapsulant (for instance a first mold compound). Additionally, it is possible to encapsulate a part of the sensing device with a separate encapsulant after attaching the sensing device to the carrier or to the first encapsulant.

In embodiment, the package comprises a common or an overall encapsulant at least partially encapsulating the carrier, the sensing device, the (first) encapsulant and the at least one component. Hence, it is also possible to encapsulate (in particular by a further molding procedure, more particularly an overmolding procedure) the assembled sub-assemblies of carrier, chip and encapsulant on the one hand and component and further encapsulant on the other hand by yet another encapsulant as a robust shell for mechanically protecting all constituents of the package.

In an embodiment, any of the (first) encapsulant and/or the separate encapsulant and/or the overall encapsulant comprises a mold compound. Hence, the respective encapsulant may comprise a mold, in particular a plastic mold. For instance, a correspondingly encapsulated component (in particular one or more of the sensing device, the current path, and the conductive trace) may be provided by placing the component (or, more generally, at least one component) between an upper mold tool and a lower mold tool and to inject liquid mold material therein. After solidification of the mold material, formation of the encapsulant (here a mold body) is completed. If desired, the mold material may be filled with particles improving its properties.

According to an embodiment, a support element for the conductive trace is provided before providing (e.g. injecting) the encapsulant. According to a further embodiment, a support element for the current path is provided before providing (e.g. injecting) the encapsulant. The support element(s) may prevent or at least reduce a deformation of the corresponding supported element (i.e. the conductive trace or the current path) due to the providing (e.g. injecting) of the encapsulant.

According to a further embodiment, the support element is removed after providing the encapsulant over at least part of the support element and the corresponding supported element (i.e. the conductive trace or the current path). In particular, according to an embodiment the support element is removed after solidification of the encapsulant (e.g. the mold material). Removal of the support element results in a hole in the encapsulant. According to an embodiment, the hole in the encapsulant is filled with an electrically insulating filling material.

According to an embodiment, the encapsulant comprises a hole, in particular a hole exposing the conductive trace. According to a further embodiment, the encapsulant comprises a hole exposing the current path. According to a further embodiment, the hole (i.e. the at least one hole) is filled with an electrically insulating filling material.

According to an embodiment, the package further comprising a mounting side which is configured to be mounted to a support (e.g. a printed circuit board (PCB) or a direct copper bonding (DCB)). According to a further embodiment, the sensor element faces away from the mounting side and/or facing away from the current path. According to a further embodiment, positioning the sensing device comprises positioning the sensor element facing away from the mounting side and/or facing away from the current path.

According to another embodiment, the support is a printed circuit board (PCB). Thus, the support may be in particular manufactured on the basis of resin (in particular epoxy resin), if desired mixed with particles (such as fibers, for instance glass fibers). Suitable dielectric materials for the PCB are e.g. prepreg or FR4. A suitable electrically conductive material for the PCB is copper.

According to an embodiment, the support is a layered structure comprising a ceramic part and a metal part. For example, according to an embodiment the support is a direct copper bonding (DCB) comprising a ceramic plate and copper layers bonded to one side thereof (or two opposing sides thereof). Bonding between the copper layer and the ceramic plate may be provided by a copper-oxygen eutectic which forms bonds between the copper layer and the ceramic plate. The copper-oxygen eutectic may be formed by heating the copper layer and the ceramic plate to controlled temperature in an atmosphere of nitrogen containing an amount of 20-40 ppm of oxygen. The copper layer bonded to the ceramic may be shaped into a pattern (e.g. the copper layer may be preformed (e.g. stamped) before the bonding to the ceramic plate or may be structured (e.g. by etching). According to an embodiment, the formation of the copper layer on the ceramic plate comprises applying a seed layer and plating the seed layer. The ceramic material may comprise for example one or more of alumina ($Al2O3$), aluminum nitride (AlN) or beryllium oxide (BeO). the copper layers may have a thickness in a range between 200 micrometer (μm) and 300 μm and may be plated, e.g. with nickel, a nickel alloy, aluminum nickel or aluminum.

According to an embodiment, the conductive trace comprising an first end portion and the current path comprising a second end portion, wherein the first and second end portions define a distance (minimum spacing) between the conductive trace and the current path. According to a further embodiment, the first end portion, the second end portion and the sensing device are located at different levels in a direction perpendicular to a main surface of the sensing device. According to an embodiment, the first end portion is located at a level between the sensing device and the second end portion. According to a further embodiment the second end portion is located at a level between the sensing device and the first end portion.

According to a further embodiment, the first end portion is located at a level below the sensing device, e.g. at a level between the sensing device and the current path. In this application, the term "level" may in particular denote a distance from a bottom surface of the package. According to a further embodiment, the first end portion is located at the level below the current path.

According to an embodiment, the conductive trace comprises a raised portion being spaced from the sensing device. For example, the first end portion may be located at a level below the level of the raised portion. This allows for the raised portion to be exposed from the encapsulant while at the first end portion is located within the encapsulant. This may allow for a secure attachment of the conductive trace in the encapsulant.

According to an embodiment, the relative positions of the current path in the conductive trace are determined by the three dimensional shape of the respective leadframe portion. The shape of the respective leadframe portion may be obtained by bending the leadframe.

According to an embodiment, the package further comprises a bond wire electrically connecting the conductive trace and the contact pad. Accordingly, in the method of manufacturing the package the electrically connecting of the contact pad to the conductive trace may comprise providing a bond wire between the contact pad and the conductive trace.

A bond wire may have the shape of a round filament or the shape of a flat ribbon, so that the bond wire may also be configured as a bond ribbon. Establishing a connection by one or more bond wires is a simple procedure which may implement bond wires made of copper and/or aluminum.

Other electrical connections are also possible, depending on the geometry of the conductive trace with respect to the contact pad.

According to an embodiment, the current path is at least partially surrounded by the encapsulant.

According to a further embodiment, the current path comprises an exposed portion forming part of an outer surface of the package. In other words, according to an embodiment a leadframe forming the current path may be shaped as an exposed pad.

According to an embodiment, the sensing device comprises at least one Hall sensor, in particular at least two Hall sensors.

According to a further embodiment, the sensing device comprises at least one magnetoresistance sensor, in particular at least two magnetoresistance sensors.

Two or more sensors (Hall sensors and/or magnetoresistance sensors) provide the advantage that the signals thereof may be combined so as to provide a differential signal from which an influence of external magnetic fields (which are not related to the current to be measured and which are undesired) is removed or at least reduced.

According to an embodiment, the current path is electrically connected to a first set of contact pins; the conductive trace being electrically connected to a contact pin of a second set of contact pins; and the first set of contact pins and the second set of contact pins are located on opposite sides of the package. Such a geometry of contact pins may facilitate the electrical insulation of the current path and the electrical connection to the sensing device.

The current path may have any geometry suitable for providing an appropriate current density and hence an appropriate magnetic field for the sensor device.

According to an embodiment, the current path comprises a measurement portion of reduced cross-section; the measurement portion extending between two spaced apart side portions (of the current path). According to an embodiment, the measurement portion is a straight portion of the current path. This may facilitate providing the measurement portion with defined dimensions.

According to an embodiment, the side portions have a thermal mass which is larger than the thermal mass of the straight portion, in particular by a factor of at least two, e.g. at least four or at least six. According to an embodiment, each side portion is electrically connected to one or more leads (which in an embodiment are also formed from the leadframe, from which the measurement portion and the side portions are formed). The relatively large thermal mass of the side portions improves removal of thermal energy from the measurement portion which in turn allows a higher current density and hence a better sensitivity of the current sensor package.

According to an embodiment, a length of the measurement portion between the side portions is smaller than a width of the measurement portion perpendicular to the length. In other words, the length of the measurement portion corresponds to the distance of the site portions which is bridged by the measurement portion. For example, a ratio of the length of the measurement portion over its width is in a range between 0.5 and 0.95 and is e.g. 0.75.

According to an embodiment, at least one of the side portions, e.g. each side portion comprises a through hole. Due to the relatively large surface area of the site portions, such a through hole may reduce or prevent the formation of voids in the encapsulant and/or may improve the structural integrity of the combination of the side portions and the encapsulant. The above and other objects, features and advantages of the present invention will become apparent from the following description and the appended claims, taken in conjunction with the accompanying drawings.

DETAILED DESCRIPTION

The illustration in the drawings is schematically and not to scale. In the drawings, similar elements or functionality similar elements are denoted by the same reference signs or by reference signs which differ from each other only within the first digit. In order to avoid unnecessary repetitions, the description of such a similar elements is not repeated in subsequent figures.

FIG. 1 illustrates a cross-sectional view of a current sensor package 100 according to embodiments of the herein disclosed subject matter.

According to an embodiment, the package 100 comprises a current path 102, e.g. a current rail. In accordance with a further embodiment, the package 100 comprises a sensing device 104. According to an embodiment, the sensor device 104 is a sensor chip comprising at least one sensor element, e.g. two sensor elements 106, e.g. two Hall sensors or two magnetoresistance sensors. According to an embodiment, the sensing device 104 comprises a first main surface 105 wherein the at least one sensor element 106 is located in or close to the first main surface 105. In accordance with an embodiment, the first main surface 105 faces away from the current path 102. In other words, in accordance with an embodiment, the at least one sensor element 106 faces away from the current path 102.

According to an embodiment, the sensing device 104 is spaced from the current path 102 by a distance 108. The sensing device 104 comprises a contact pad 110 which faces away from the current path 102, e.g. as shown in FIG. 1. The contact pad 110 is electrically connected to a conductive trace 112 by a bond wire 114. In accordance with an embodiment, the conductive trace 112 is a sensor pin, e.g. as shown in FIG. 1.

According to a further embodiment, the package 100 comprises an encapsulant 116 extending continuously without internal interfaces between the current path 102 and the sensing device 104. In accordance with an embodiment, the encapsulant 116, the current path 102 and the conductive trace 112 form part of a premold part two which the sensing device may be attached in a separate manufacturing step (e.g. after curing the encapsulant 116).

In accordance with an embodiment, the encapsulant 116 extending between the current path 102 and the sensing device 104 electrically isolates the high voltage potential at the current path 102 from the low voltage potential at the conductive trace 112.

According to an embodiment, the conductive trace 112 comprises a first end portion 118 and the current path 102 comprises a second end portion 119 which end portions defines a distance 120 between the conductive trace 112 and the current path 102. In accordance with an embodiment, the first end portion 118 is located at a level 122 which is below the sensing device 104. In other words, the first end portion 118 is spaced from a lower main surface 124 of the sensing device 104.

According to an embodiment, the second end portion 119 of the current path 102 is located at a level 126 between the sensing device 104 and the first end portion 118. In other words, the second end portion 119 of the current path 102 is spaced from the lower main surface 124 by the distance 108 and the first end portion 118 is spaced from the lower main surface 124 by a further distance 128 which is larger than the distance 108.

According to an embodiment, the conductive trace 112 comprises a raised portion 130 which is spaced from the sensing device 104. In accordance with an embodiment, the bond wire 114 is bonded to the conductive trace 112 at the raised portion 130 in a contact region 132. According to an embodiment, the raised portion 130 is exposed with respect to the encapsulant 116 in the contact region 132.

According to an embodiment, the current path 102 is connected to a first set of contact pins 134 extending out of the package 100. According to a further embodiment, the conductive trace 112 is electrically connected to a contact pin of a second set of contact pins 136 extending out of the package 100. In accordance with an embodiment, the first set of contact pins 134 and the second set of contact pins 136 are located on opposite sides of the package 100, e.g. as shown in FIG. 1.

According to an embodiment, the encapsulant 116 comprises a hole 138 exposing the conductive trace 112. In accordance with an embodiment, the hole 138 arises from a support pin (not shown in FIG. 1) which supported the conductive trace 112 during forming the encapsulant 116, in particular during forming the encapsulant 116 between the current path 102 and the conductive trace 112. In accordance with an embodiment, the hole 138 is filled with an electrically insulating filling material 139 such as e.g. silicone, epoxy, etc. In accordance with an embodiment, the hole 138 is located at the position such that an interface 140 between the encapsulant 116 and the filling material 139 is not located between the current path 102 and the sensing device 104 or between the current path 102 and the conductive trace 112.

According to a further embodiment, the encapsulant 116 comprises a hole 142 exposing the current path 102. In accordance with an embodiment, the hole 142 arises from a support pin (not shown in FIG. 1) which supported the current path 102 during forming the encapsulant 116, in particular during forming the encapsulant 116 between the current path 102 and the sensing device 104. In accordance with an embodiment, the hole 142 is filled with an electrically insulating filling material 144 such as e.g. silicone, epoxy, etc. In accordance with an embodiment, the hole 142 is located at the position such that an interface 146 between the encapsulant 116 and the filling material 139 is not located between the current path 102 and the sensing device 104 or between the current path 102 and the conductive trace 112.

In accordance with an embodiment, the sensing device 104 is attached to an attachment surface 148 of the encapsulant 116 e.g. by means of a die attach layer 150, e.g. a die attach film. According to an embodiment, the encapsulant has shaped therein a recess 152 in which the sensing device 104 and the bond wire 114 are located. In accordance with an embodiment, the recess 152 is filled with an insulating filling material 154 such as epoxy, silicone, etc. According to an embodiment, the insulating filling material 154 may be provided for protection of the sensing device 104 and/or the bond wire 114. In accordance with an embodiment, the sensing device 104 is at least partially enclosed by the encapsulant 116 (mold body).

In accordance with an embodiment, a lid 156 may be provided to close the recess 152.

Further, FIG. 1 illustrates some isolation aspects according to embodiments of the herein disclosed subject matter. In particular, FIG. 1 further illustrates in particular the distances 108, 120 between a high voltage side 160 (comprising in particular the current path 102) on the one and a supply voltage side 162 (low voltage side, comprising in particular the conductive trace 112, the bond wire 114 and the sensing device 104) on the other hand.

Further illustrated in FIG. 1 is the creepage/clearance distance 164 between exposed portions of the high-voltage side 160 (in particular of the current path 102) and the low voltage side 162 (in particular the conductive trace 112). Accordingly and in accordance with an embodiment, creepage may occur along an outer surface of the current sensor package but not along interfaces within the current sensor package (e.g. interfaces within the encapsulant (116), as such interfaces are avoided (as far as possible/suitable)). In an embodiment at least interfaces between the current path 102 and the conductive trace 112 and between the current path 102 and the sensing device 104 are avoided (i.e. in these regions the encapsulant 116 is free of interfaces).

In accordance with a further embodiment, the current sensor package 300 comprises a mounting side 163 which is configured to be mounted to a support, e.g. a printed circuit board, a direct copper bonding, etc. In accordance with an embodiment, the sensor element 106 faces/main surface 105 faces away from the mounting side 163.

Figure 2:
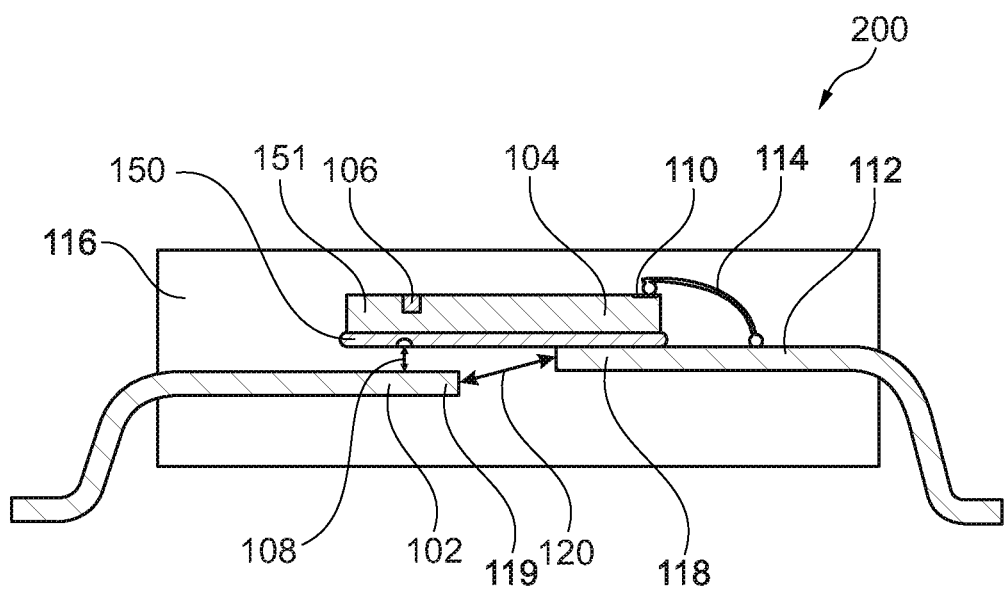
FIG. 2 illustrates a cross-sectional view of a further current sensor package according to embodiments of the herein disclosed subject matter.

FIG. 2 illustrates a cross-sectional view of a further current sensor package 200 according to embodiments of the herein disclosed subject matter.

In the description of FIG. 2, a repetition of the description of elements which are similar or identical two elements of FIG. 1 is avoided. The description of such elements provided with regard to FIG. 1 is valid also for FIG. 2.

In accordance with an embodiment, the conductive trace 112 is a carrier or part of a carrier and is in particular a lead finger of a leadframe. In accordance with a further embodiment, the sensing device 104 is attached at least partially to the conductive trace 112, e.g. by a die attach layer 150. In particular, according to an embodiment the sensing device 104 extends beyond the conductive trace 112, the thus having a free end 151 which is located over the current path 102 (about spaced from the current path 102). According to a further embodiment, not shown in FIG. 2, the current path 102 is exposed and forms a part of a surface of the package 200.

Instead of a bond wire 114, which electrically connects the contact pad 110 and the conductive trace 112, a through silicon via, extending through the sensing device 104, may be provided (not shown in FIG. 2).

In accordance with an embodiment, the encapsulant 116 is provided after positioning of the current path 102, the sensing device 104 and the conductive trace 118 and after electrically connecting the sensing device 104 with the conductive trace 118. In accordance with an embodiment, the encapsulant 116 is a mold body as shown in FIG. 2.

In accordance with a further embodiment, the first end portion 118 of the conductive trace 112 is located at a level between the sensing device 104 and the second end portion 119, e.g. as shown in FIG. 2.

Figure 3:
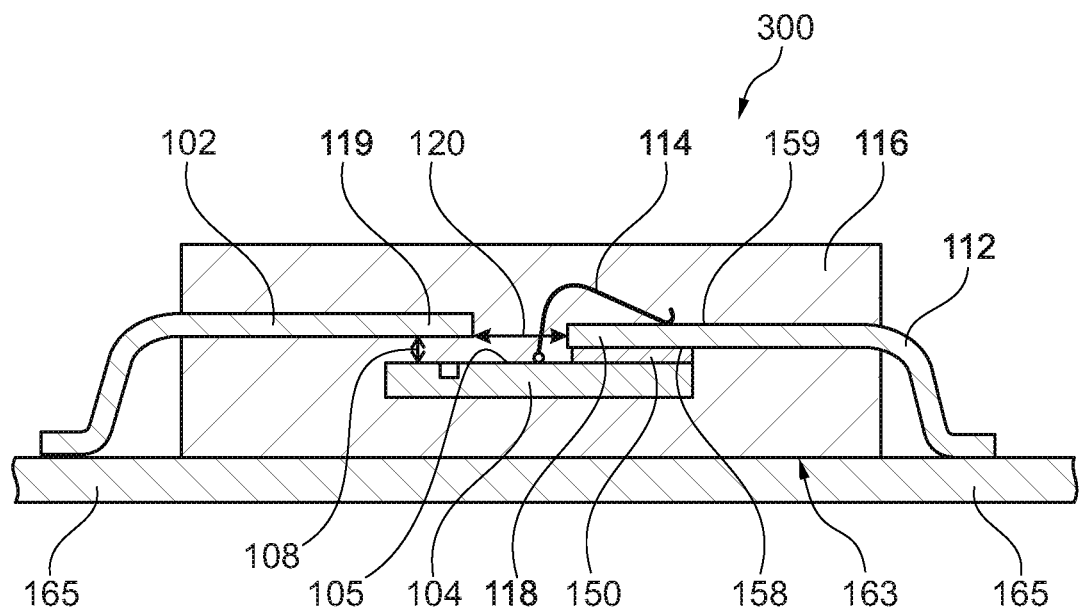
FIG. 3 illustrates some isolation aspects according to embodiments of the herein disclosed subject matter for the current sensor package of FIG. 1.

FIG. 3 illustrates a cross-sectional view of a further current sensor package 300 according to embodiments of the herein disclosed subject matter.

The current sensor package 300 is similar to the current sensor package 200 of FIG. 2 but the first with respect to the location of the sensing device 104. In particular, according to an embodiment the conductive trace 112 comprises two opposing first and second sides 158, 159 wherein the sensing device 104 is attached to the first side 158 of the conductive trace 112 and the bond wire 114 is attached to the second side 159 of the conductive trace 112, e.g. as shown in FIG. 3. It is noted, that in contrast to this embodiment, in the current sensor package 200 of FIG. 2 both the sensing device 104 and the bond wire 114 are attached to the same side of the conductive trace 112.

In accordance with an embodiment, the end portion 118 of the conductive trace 112 is located at the level between the end portion 119 of the current path 102 and the sensing device 104, e.g. as shown in FIG. 3.

In accordance with a further embodiment, the encapsulant 116 is free of any holes exposing the conductive trace 112 or the current path 102. In other words, according to an embodiment the encapsulant 116 does not comprise holes 138, 142 as described with regard to FIG. 1.

In accordance with an embodiment, the first main surface 105 of the sensing device 104 (or differently said, the at least one sensor element 106) faces towards the current path 102. In accordance with a further embodiment, the at least one sensor element 106 faces away from the mounting side 163 of the current sensor package 300. The mounting side 163 is configured to be mounted on a support 165.

Figure 4:
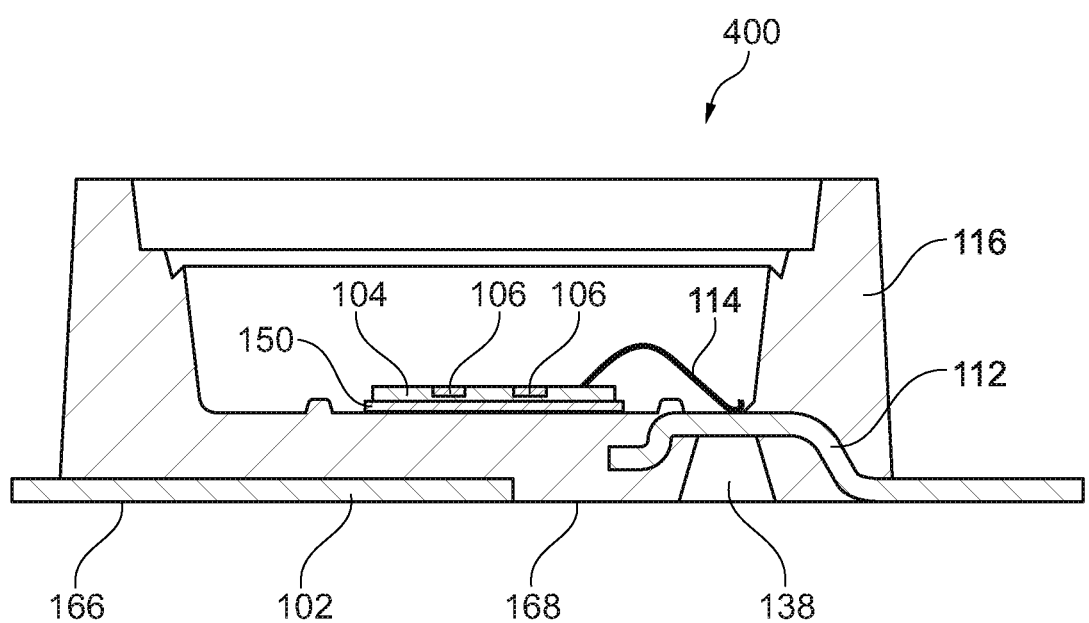
FIG. 4 illustrates a cross-sectional view of a further current sensor package according to embodiments of the herein disclosed subject matter.

FIG. 4 illustrates a cross-sectional view of a further current sensor package 400 according to embodiments of the herein disclosed subject matter.

In the description of FIG. 4, a repetition of the description of elements which are similar or identical two elements of FIG. 1 is avoided. The description of such elements provided with regard to FIG. 1 is valid also for FIG. 4.

In accordance with an embodiment, the current path 102 comprises an exposed portion 166 forming part of an outer surface 168 of the package 400.

FIG. 5 to FIG. 10 illustrate different geometries of a current path 102 (current rail) according to embodiments of the herein disclosed subject matter.

Figure 5:
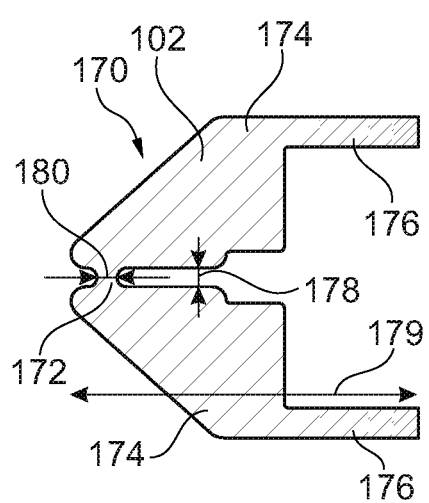
FIG. 5 to FIG. 10 illustrate different geometries of a current path (e.g. a current rail) according to embodiments of the herein disclosed subject matter.

FIG. 5 illustrates an exemplary first geometry 170 of a current path 102.

In accordance with an embodiment, the current path 102 is a current rail. In accordance with an embodiment, the current path 102 comprises a measurement portion 172, wherein the measurement portion has a reduced cross-section. In other words, if the thickness of the current path is approximately constant the different cross-section at different positions of the current path can be estimated by the different lateral dimension of the current path. In accordance with a further embodiment, the current path 102 comprises two spaced apart side portions 174. In accordance with a further embodiment, the measurement portion 172 extends between the two side portions 174.

According to an embodiment, the measurement portion 172 is a straight portion of the current path 102. According to a further embodiment, the side portions 174 have a thermal mass which is larger than the thermal mass of the straight portion in particular by a factor of at least two, e.g. as shown in FIG. 5. According to an embodiment, each side portion 174 is connected to one or more leads 176, e.g. one lead 176 as shown in FIG. 5. Accordingly, in an embodiment each side portion 174 is delimited by the measurement portion 172 and the lead 176. According to an embodiment, a length 178 of the measurement portion 172 between the side portions 174 is smaller than a width 180 of the measurement portion perpendicular to the length 178. For example, according to an embodiment the length 178 is about 300 μm, the width 180 is about 400 μm and the entire length 179 of the current path 102 is 4.56 mm.

Figure 6:
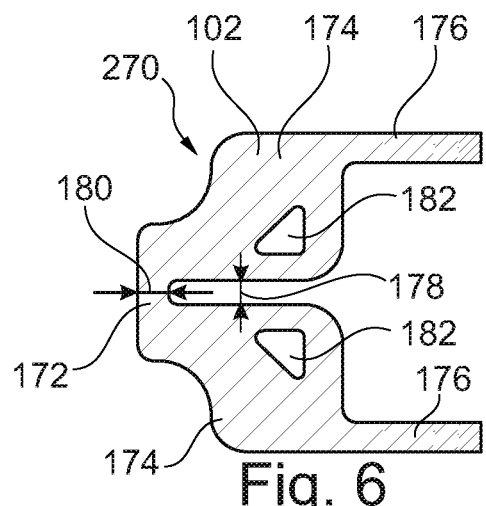

FIG. 6 illustrates an exemplary second geometry 270 of a current path 102.

In accordance with an embodiment, each side portion 174 comprises a through hole 182, e.g. as shown in FIG. 6. According to an embodiment, the through hole 182 has a triangular shape, as shown in FIG. 6.

Figure 7:
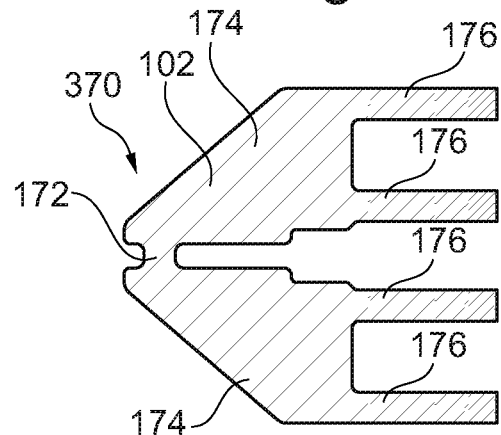

FIG. 7 illustrates an exemplary third geometry 370 of a current path 102.

The third geometry 370 is similar to the first geometry 170 of FIG. 5. According to an embodiment, each side portion is connected to two leads 176, e.g. as shown in FIG. 7.

Figure 8:
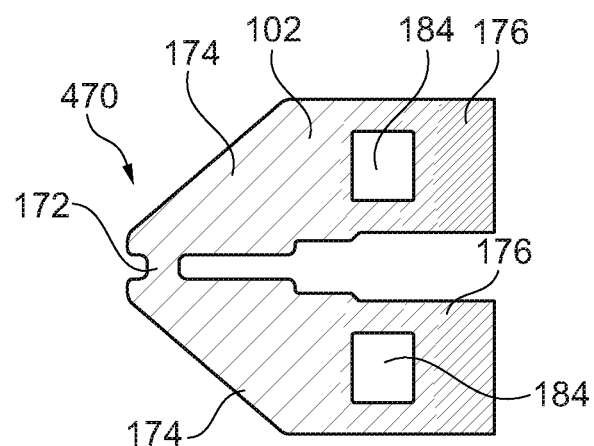

FIG. 8 illustrates an exemplary fourth geometry 470 of a current path 102.

The fourth geometry 470 is similar to the first geometry 170 and third geometry 370. According to an embodiment, each side portion 174 is electrically connected to one lead 176 which has a width similar to the maximum width of the side portion 174, e.g. as shown in FIG. 8. For example, according to an embodiment, a maximum width of the lead 176 is in the range of about 80% to 120% of the maximum width of the side portion 174. Further in accordance with an embodiment, a through hole 184 is formed in the lead 176.

Figure 9:
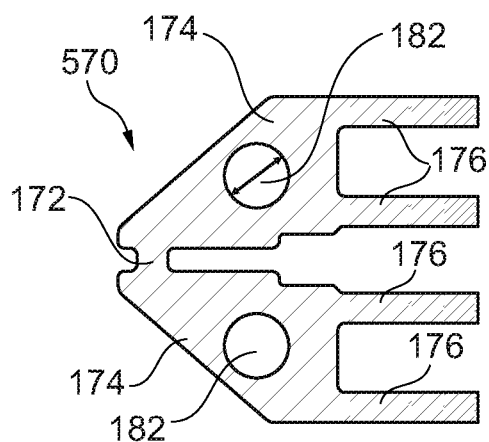

FIG. 9 illustrates an exemplary fifth geometry 570 of a current path 102.

The fifth geometry 570 is similar to the third geometry 370 of FIG. 7. According to an embodiment, a through hole 182 is formed in the site portions 174, e.g. as shown in FIG. 9. According to an embodiment, the through hole has a circular shape, e.g. as shown in FIG. 9.

Figure 10:
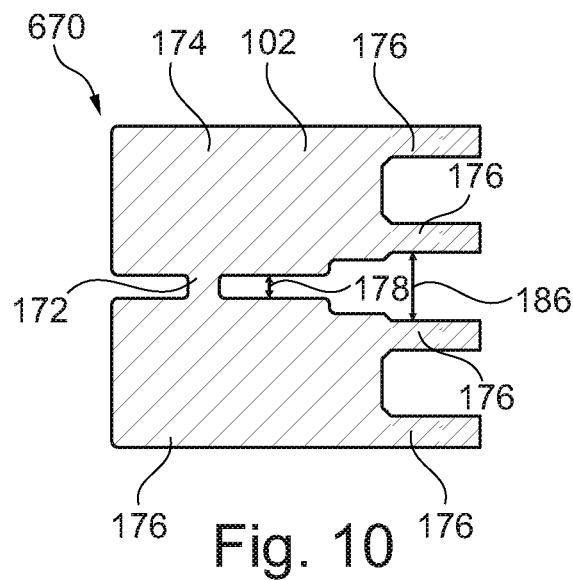

FIG. 10 illustrates an exemplary sixth geometry 670 of a current path 102.

In accordance with an embodiment, the side portions 174 have a generally rectangular shape.

In summary, having regard to FIG. 5 to FIG. 10, according to an embodiment, the shape of the site portions tapers in a direction from the lead 176 to the measurement portion 172 and has a general triangular shape, e.g. as shown in FIGS. 5, 7, 8 and 9. According to an embodiment each side portion has in a direction from the lead 176 to the measurement portion 172 a first part of increasing cross-section and a second part of the increasing cross-section, e.g. as shown in FIGS. 5, 6, 7, 8 and 9. According to a further embodiment, a distance between opposing side portions 174 of the current rail 102 changes from a first distance 186 (see FIG. 10) of opposing leads 176 to the length 178 of the measurement portion 172, in particular in a stepwise manner, e.g. as shown in FIG. 5 to FIG. 10.

Figure 11:
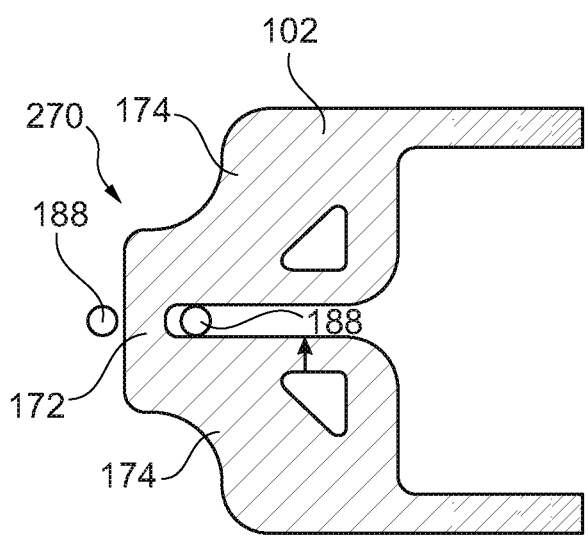
FIG. 11 shows the exemplary second geometry of the current path of FIG. 6 and illustrates a possible location for two Hall sensors.

FIG. 11 shows the exemplary second geometry 270 of the current path 102 of FIG. 6 and illustrates a possible location for two Hall sensors 188.

According to an embodiment, a first Hall sensor 188 is located between the two side portions 174 proximate to (e.g. besides) the measurement portion 172. According to an embodiment, a second Hall sensor 188 is located opposite the first Hall sensor 188 with the measurement portion 172 extending between the two or sensors 188, e.g. as shown in FIG. 11.

Figure 12:
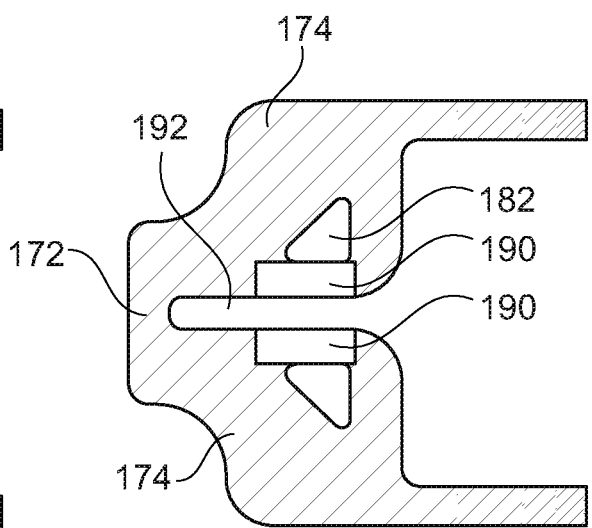
FIG. 12 shows the exemplary second geometry of the current path of FIG. 6 and illustrates a possible location for two magnetoresistance sensors.

FIG. 12 shows the exemplary second geometry 270 of the current path 102 of FIG. 6 and illustrates a possible location for two magnetoresistance sensors 190.

According to an embodiment, the current path 102 comprises a slit 192 between the two side portions 174. According to an embodiment, a first magnetoresistance sensor 190 is located between the slit 192 and the opening 182 of one of the two side portions 174 and a second magnetoresistance sensor 190 is located between the slit 192 and the opening 182 of the other of the two side portions 174, e.g. as shown in FIG. 12.

Figure 13:
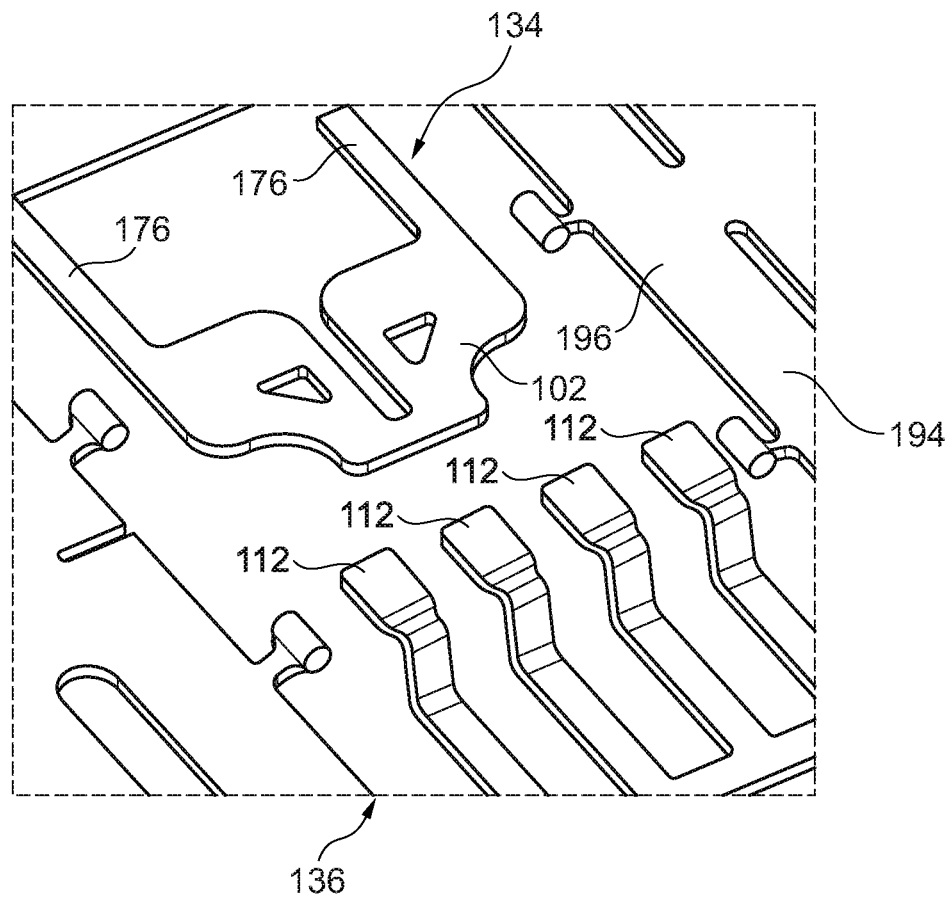
FIG. 13 illustrates a leadframe according to embodiments of the herein disclosed subject matter.

FIG. 13 illustrates perspective view of a leadframe 194 according to embodiments of the herein disclosed subject matter.

According to an embodiment, the leadframe 194 comprises the current path 102, four conductive traces 112 and a connecting portion 196 connecting the current path 102 and the conductive traces 112. After manufacturing the current sensor package 100 according to embodiments of the herein disclosed subject matter on the basis of the leadframe 194, the first set of contact pins 134 (i.e. the leads 176 of the current path 102) and the second set of contact pins 136 (compare also FIG. 1) are separated from the connecting portion 196.

It should be noted that the term "comprising" does not exclude other elements or features and the "a" or "an" does not exclude a plurality. Also elements described in association with different embodiments may be combined. It should also be noted that reference signs shall not be construed as limiting the scope of the claims. Moreover, the scope of the present application is not intended to be limited to the particular embodiments of the process, machine, manufacture, composition of matter, means, methods and steps described in the specification. Accordingly, the appended claims are intended to include within their scope such processes, machines, manufacture, compositions of matter, means, methods, or steps.

What is claimed is:

1. A current sensor package, comprising:
   a current path;
   a sensing device, in particular a sensor chip, the sensing device being spaced from the current path, and the sensing device being configured for sensing a magnetic field generated by a current flowing through the current path;
   the sensing device comprising a sensor element, the sensing device being electrically connected to a conductive trace;
   a mounting side which is configured to be mounted to a support;
   an encapsulant extending continuously between the current path and the sensing device and between the current path and the mounting side where the sensing device extends over the current path;
   the encapsulant extending continuously between the current path and the conductive trace; and
   the sensing device being attached to the encapsulant.

2. The package according to claim 1, the conductive trace being a carrier, in particular a leadframe.

3. The package according to claim 1, the current path is formed form a metallic carrier, in particular a leadframe.

4. The package according to claim 1, the encapsulant comprising a hole exposing the conductive trace, the hole being filled with an electrically insulating filling material.

5. The package according to claim 1,
   the conductive trace comprising a first end portion and the current path comprising a second end portion wherein the first and second end portions define a distance between the conductive trace and the current path, wherein the first end portion, the second end portion and the sensing device are located at different levels in a direction perpendicular to a main surface of the sensing device;
   in particular wherein the first end portion is located at a level between the sensing device and the second end portion or wherein the second end portion is located at a level between the sensing device and the first end portion.

6. The package according to claim 5, the conductive trace comprising a raised portion being spaced from the sensing device.

7. The package according to claim 1, the sensing device further comprising a contact pad and the package further comprising a bond wire electrically connecting the conductive trace and the contact pad.

8. The package according to claim 1, wherein the current path comprises an exposed portion forming part of an outer surface of the package.

9. The package according to claim 1, wherein the sensing device comprises at least one further sensor element.

10. The package according to claim 1, wherein the sensor element of the sensing device is one of a Hall sensor, and a magnetoresistance sensor, in particular wherein the magnetoresistance sensor is an anisotropic magnetoresistance sensor, a giant magnetoresistance sensor, a colossal magnetoresistance sensor, or a tunnel-magnetoresistance sensor.

11. The package according to claim 1,
    the current path being electrically connected to a first set of contact pins;
    the conductive trace being electrically connected to a contact pin of a second set of contact pins; and
    the first set of contact pins and the second set of contact pins being located on opposite sides of the package.

12. The package according to claim 1,
    the current path comprising a measurement portion of reduced cross-section;
    the measurement portion extending between two spaced apart side portions;
    in particular wherein the measurement portion is a straight portion of the current path;
    in particular wherein the side portions have a thermal mass which is larger than the thermal mass of the straight portion, in particular by a factor of at least two.

13. The package according to claim 12, wherein a length of the measurement portion between the side portions is smaller than a width of the measurement portion perpendicular to the length.

14. The package according to claim 12, wherein each side portion comprises a through hole.

15. The package according to claim 1, wherein the encapsulant, the conductive trace;
    and the current path form part of a premold part, in particular wherein the premold part comprises an attachment surface and the sensing device is attached to the attachment surface.

16. The package according to claim 1,
    the sensor element facing away from the mounting side and/or facing away from the current path.

* * * * *